United States Patent [19]
Kataoka et al.

[11] Patent Number: 5,597,422
[45] Date of Patent: Jan. 28, 1997

[54] LIGHT-TRANSMISSIVE RESIN SEALED SEMICONDUCTOR AND PRODUCTION PROCESS THEREOF

[75] Inventors: Ichiro Kataoka, Tsuzuki-gun; Takahiro Mori, Ikoma; Satoru Yamada; Hidenori Shiotsuka, both of Tsuzuki-gun; Ayako Komori, Nara, all of Japan

[73] Assignee: Canon Kabushiki Kaisha, Tokyo, Japan

[21] Appl. No.: 429,049

[22] Filed: Apr. 26, 1995

[30] Foreign Application Priority Data

Apr. 30, 1994 [JP] Japan .................................. 6-114113

[51] Int. Cl.⁶ .................................................. H01L 31/048
[52] U.S. Cl. ................ 136/259; 136/251; 156/242; 156/300; 156/307.5; 156/307.7; 437/2; 437/4; 437/211; 437/212; 257/433; 257/788; 257/789; 257/795
[58] Field of Search .................................. 136/251, 259; 257/433, 788–789, 795; 437/2–5, 211–212; 156/298–300, 307.5, 307.7, 242

[56] References Cited

U.S. PATENT DOCUMENTS 4,953,577  9/1990  Marshall ................. 136/251

FOREIGN PATENT DOCUMENTS

| 0641030 | 3/1995 | European Pat. Off. | 136/251 |
|---|---|---|---|
| 61-101083 | 5/1986 | Japan | 136/251 |
| 61-251176 | 11/1986 | Japan | 136/251 |
| 1-244669 | 9/1989 | Japan | 136/251 |
| 2-177373 | 7/1990 | Japan | 136/251 |
| 6-196742 | 7/1994 | Japan | 136/251 |
| WO95/01655 | 7/1994 | WIPO | 136/251 |

OTHER PUBLICATIONS

Jet Propulsion Laboratory Report, "Investigation of Test Methods, Material Properties, and Processes for Solar Cell Encapsulants", U.S. Department of Energy, Jun. 1979.

*Primary Examiner*—Aaron Weisstuch
*Attorney, Agent, or Firm*—Fitzpatrick, Cella, Harper & Scinto

[57] ABSTRACT

The object is to provide a light-transmissive resin sealed semiconductor that is excellent in weatherability, heat resistance and fire retardancy, limits the performance deterioration of a photovoltaic element for a long term due to moisture permeation to an minimum extent, has rubber elasticity necessary for protecting the semiconductor element, and has a surface covering material that is incombustible or fire retardant. This object is achieved by a construction wherein a covering material provided on the surface of the incident light side of photovoltaic element (101), comprises a transparent filler (102) that is cross-linked multi-component copolymer containing vinylidene fluoride and hexafluoropropylene as the major components.

21 Claims, 2 Drawing Sheets

FIG. 6
PRIOR ART

LIGHT-TRANSMISSIVE RESIN SEALED SEMICONDUCTOR AND PRODUCTION PROCESS THEREOF

BACKGROUND OF THE INVENTION

1. Field of the Invention

The present invention relates to a light-transmissive resin sealed semiconductor and a production process thereof, and specifically relates to a solar cell module and a production process thereof. The solar cell nodule comprises a photoelectric transducer in which a semiconductor photoactive layer as a light converting element and a conductive layer are formed on a substrate having a conductive surface. The solar cell module is particularly excellent in heat resistance and fire retardancy.

2. Related Background Art

Nowadays, environmental problems have been increasingly noted worldwide. In particular, global warming caused by $CO_2$ emission has been a serious concern and the need for clean energy that does not exhaust $CO_2$ increases. Solar cells are expected to be useful as a clean energy source because of their safety and ease in handling.

There are various types of solar cells; typical examples include crystalline silicon solar cells, polycrystalline silicon solar cells, amorphous silicon type solar cells, copper-indium-selenide solar cells, and compound semiconductor solar cells. Among them, thin film crystalline silicon solar cells, compound semiconductor solar cells, and amorphous silicon type solar cells have been active subjects of R&D since large area cells may be realized at a relatively low cost.

In particular, a thin film solar cell, typically represented by an amorphous silicon type solar cell in which silicon is deposited on a metal substrate having a conductive surface and a transparent conductive layer is formed thereon, is light in weight and excellent in impact resistance and flexibility, and offers hope to be useful in module form from among the above mentioned solar cells. A solar cell module that is flexible requires protection of the internal solar cells by covering the surface of the incident light side thereof with a transparent covering material, unlike the case of silicon deposition on a glass substrate.

As for such surface covering material, a construction may be considered wherein a transparent thin film of a fluoride polymer such as a fluororesin film or fluororesin coating is provided on the topmost surface and various transparent organic thermoplastics are provided inwardly thereof. This construction is based on the facts that a fluoride polymer is excellent in weatherability and water repellency, thereby making smaller the reduction of conversion efficiency of the solar cell module caused by decrease of the light transmittance due to yellowing, cloudiness, or fouling of the surface and that a transparent organic thermoplastic is inexpensive and a large amount may be used as a filler protecting the photovoltaic element which is made of a semiconductor.

Figure 6:
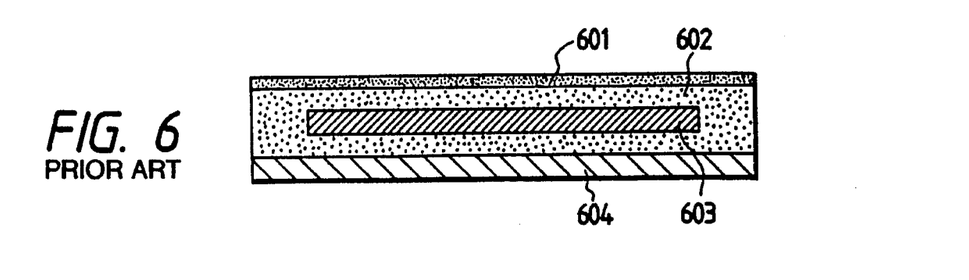
FIG. 6 is a schematic sectional view of another solar cell module shown for the purpose of comparison.

FIG. 6 shows an example of a conventional solar cell module. This solar cell module comprises a thin film layer 601 of a fluoride polymer, a thermoplastic transparent organic resin 602, a photovoltaic element 603, and an insulating layer 604. In the construction of this solar cell module, an organic resin such as is used for the light receiving surface is also used at the back surface.

More specifically, fluoride polymer thin film layer 601 is composed of a fluororesin film such as an ethylene-tetrafluoroethylene copolymer (ETFE) film or polyvinyl fluoride (PVF) film; thermoplastic transparent organic resin 602 is produced from ethylene-vinyl acetate copolymer (EVA), butyral resin or the like; and insulating layer 604 is selected from various organic resin films including nylon film and aluminum laminated Tedlar film. In this solar cell module, thermoplastic transparent organic resin 602 functions as the adhesive that idheres photovoltaic element 603 to fluororesin film 601 and to insulating layer 604 and as the filler that protects the solar cells against scratches and impacts.

However, in a solar cell module with such structure as described above having a surface covering material, the thermoplastic transparent organic resin used as the filler becomes cloudy due to partial gelation of the resin during outdoor exposure for as long as 20 years or yellowing occurs in the resin due to an increase in the number of conjugated double bonds; these inevitably cause a decrease of light transmittance of the resin and conversion efficiency of the solar cell module. This problem is more serious in applications where the module is incorporated with roofing or other construction material and the module temperature is more elevated.

Furthermore, acceleration of the yellowing is known when the module is subjected to temperature conditions exceeding 80 degrees or higher in the case of EVA filler, for example. In the case of butyral resin filler, hygroscopicity is relatively high and moisture easily attacks defective parts of the photovoltaic elements. The moisture and electric field of photovoltaic element might cause a metal compound of the collecting electrode or the like to be grown by repetition of ionization and precipitation; when such reactions proceed further, short circuits may be formed among the photovoltaic elements and the generated electric current becomes unable to be led outward, thereby lowering the conversion efficiency. Butyral resin has an additional problem that the transparency is lost under high temperature and high humidity conditions.

For overcoming these problems, Japanese Patent Publication No. 4-76229 discloses a protective film including a resin derivative which comprises a perfluoroalkylene group and active hydrogen for a CdS/CdTe type solar cell formed on a substrate. As for the resin comprising a perfluoroalkylene group and active hydrogen, a product known by the trade name of Lumiflon (Asahi Glass Co., Ltd.) is mentioned. According to Japanese Patent Publication No. 4-76229, Lumiflon is a fluorine-containing polymer having a number average molecular weight from 20,000 to 80,000 and contains perfluoroalkylene groups and pendant active hydrogens (more specifically OH group), which produce a cross-linked polymer (derivative) by reaction with melamine or a compound having an isocyanate group.

In addition, Japanese Patent Publication No. 4-76229 also discloses, in the description of the example, a protective film which is excellent in moisture resistance and is obtained by cross-linking Lumiflon with an isocyanate or a resol type phenolic resin. However, the coating process disclosed therein requires placement of the coating on the topmost surface of a solar cell; however, the pot life of the resin that has been mixed with the mentioned cross-linking agent is generally short and no one is known having a long after the cross-linking agent is mixed in. In practice, the pot life is extended by protecting the isocyanate with a blocking agent. However, adoption of the coating structure, as mentioned above, where the surface film is laminated to the resin causes a problem that the cross-linking reaction does not proceed because the blocking agent is not dissociated and, thus, not volatilized during resin cross-linking.

On the other hand, lamination of the surface film after the cross-linking of resin is difficult since the cross-linked product lacks tackiness and adhesiveness. Furthermore, when the cross-linking agent is melamine, no effective blocking agents are known. Now, the resin mentioned above should be used on the topmost surface of the solar cell module. However, the surface hardness of the resin is low and it is easily damaged by outdoor sand and dust, which will accumulate on the damaged part; thereby the sunlight might be shielded. Depending on the manner of the resin lamination, simple application of the coating might create pin holes and inclusion of dust; moisture and oxygen thus may penetrate into the photovoltaic element. It furthermore is known that thick coating with a material having rubber elasticity to protect a solar cell element is effective for preventing damage of the solar cell element caused by bending and difference of thermal expansion due to change of temperature; however, making the coating resin thick is substantially difficult, may damage the element, and does net giver sufficient protection for concave and convex parts in the solar cell surface brought by electrical wiring, etc. In addition, Lumiflon mentioned above does not have rubber elasticity.

Thus, organic surface coating materials have not been known which have both weatherability and moisture resistance at a high level.

EVA has been used because of 1) long shelf life, 2) relatively good weatherability, 3) adhesiveness to various substrates, 4) ease of cross-linking, and 5) low cost; however, EVA is easily flammable, as are many other transparent organic resins. The flammability is undesirable for application in dense residential areas not only in the case of solar cell modules installed by integration with roofing materials but also in the case of solar cell arrays installed on a frame. Making solar cell modules flame resistant or retardant is predicted to be very important in the manufacture of solar cell modules prevalent in future housing.

Covering the modules with glass would be most suitable for overcoming these problems; thus, sealing solar cells with glass has been extensively tried. However, coating with glass has such problems as lack of flexibility, impact resistance, weight reduction, and cost, In addition, even with glass coating, solar cell elements might be exposed on their back side to flame when the backside is not made of heat resistant materials; therefore it cannot be made of combustible material.

In view of these situations, fluororubber may be a candidate for use as a high performance filler for solar cells.

In a report, in 1979, of the Jet Propulsion Laboratory, US Department of Energy, entitled "Investigation of Test Methods, Materials, Properties and Processes for Solar Cell Encapsulation.", use of a fluororubber (Trade name: Viton, manufactured by DuPont) is disclosed for use as a sealing material of solar cell modules. However, with Viton, it is reported in the cited report that yellowing and peeling, due to poor adhesion to the surface material occur in the weatherability test using a Sunshine Weather-O-Meter. Thus, even now, commercial application of fluororubber to solar cell sealing is not employed.

In the case of Viton, effective cross-linking is made with a polyamine or polyol; it is known to add various metal oxides and salts, as acid receptors, which neutralize acidic substances generated in the cross-linking process of the fluororubber, which cross-linking is a type of polyol or polyamine cross-linking. For example, lead oxide or calcium hydroxide is added to cross-link; however, known acid receptors generally including polyol and polyamine are not transparent, thus, this type of cross-linked fluororubber is not suitable for solar cells. That is, the fluororubber that is to be cross-linked with polyamine or polyol is optically opaque when employed as the filler of solar cell modules; thereby, the conversion efficiency of the solar cells is decreased. Even if the acid receptor is transparent, reactions caused by removal of HF occur and the resultant fluororubber becomes brown. In addition, since the cross-linked site is bromine, the weatherability is poor; this is considered to be the reason for yellowing in the accelerated test by the Sunshine Weather-O-Meter mentioned above.

On the other hand, when the above-mentioned fluororubber is used without cross-linking, an optically transparent filler is obtained; however, temperature elevation due to incident light causes a problem. That is, the temperature of solar cell modules located on the roof or provided in a hot area is known to become 80 degrees or higher and the filler undergoes creep when used in such conditions for a long period. In other words, the fluororubber mentioned above moves away from the photovoltaic elements because it is not cross-linked and finally, the covering material may peel off.

Therefore, an object of the present invention is to overcome these problems and provide a solar cell module and production process thereof having a surface covering material, more specifically, a filler resin filling the space between the protective film on the light receiving surface and the semiconductor elements, which covering material is excellent in weatherability and heat resistance, has excellent adhesion to the surface film, limits deterioration of long term performance of the photovoltaic elements by minimizing moisture permeation, has enough rubber elasticity with a sufficient thickness to protect solar cell elements, and is fire retardant or incombustible.

SUMMARY OF THE INVENTION

A solar cell module according to the present invention, in which a covering material is provided on the surface of the incident light side of a photovoltaic element and comprises two layers; (1) a transparent filler and (2) a transparent surface sheet provided at the outermost surface of the filler, wherein the filler comprises a cross-linked multi-component copolymer (copolymer that has two or more monomers) containing fluorine in an amount of 60 to 80%, and containing vinylidene fluoride and hexafluoropropylene as the major components, and the surface sheet comprises a film of 40 to 60% fluorine content.

The production process of solar cell module according to the present invention comprises the steps as described hereinafter.

The solar cell module, according to the present invention, has the following characteristics:

(1) A covering material is provided that has excellent fire retardancy even at a thickness that gives satisfactory mechanical strength. It is to be noted here that EVA conventionally used has a heat of combustion as high as 11 Kcal/g; once the covering material is ignited, self-extinguishing cannot be expected for EVA. For improving such combustion property, countermeasures have been taken by decreasing the amount of EVA; this means a decrease in the thickness of the EVA, which in turn decreases the mechanical strength and obviously decreases the resistance to external forces.

(2) The covering material in accordance with the present invention is excellent in weatherability, probably because of the use of a fluororesin. Yellowing does not occur during use for a long period as occurs in conventional EVA and the conversion efficiency of the solar cell elements is not lowered.

(3) The filler in accordance with the present invention is excellent in moisture resistance since the fluorine content is 60% or more. Thus, moisture does not easily attack the solar cell elements, unlike conventional polyvinyl butyral resin which absorbs moisture under humid conditions, and short circuits in the solar cell elements rarely occur. Furthermore, devitrification, which is the most common defect of polyvinyl resins, does not occur, and lowering of the conversion efficiency of solar cell elements does not occur.

(4) Since a cross-linked product of a copolymer containing more than two kinds of monomer is used, the problem of peeling due to softening of the filler when used at a high temperature is prevented. Since a fluororesin is used in the filler according to the present invention, the surface covering material is excellent in heat resistance. Unlike the case of using conventional EVA in which yellowing is accelerated after the antioxidant or other ingredient used in combination is volatilized during use at a high temperature, lowering of the conversion efficiency of the solar call elements does not occur. Furthermore, adhesion is improved when a coupling agent is included in the filler.

(5) The covering is excellent in weatherability since ethylene tetrafluoride-ethylene copolymer is employed in the surface film, which is excellent in weatherability by itself and which increases the weatherability when combined with the fluororesin in the filler.

(6) In addition, a covering with excellent workability during post-treatments results if the surface film is not subjected to a drawing treatment and is composed of ethylene tetrafluoride-ethylene copolymer; that is, cracking or breakage in the surface film is prevented when the end parts of the solar cell modules are bent.

BRIEF DESCRIPTION OF THE DRAWINGS

FIGS. 2A and 2B show examples of the basic construction of the photoelectric transducer used in the solar cell module shown in FIG. 1.

DESCRIPTION OF THE PREFERRED EMBODIMENTS

The light transmitting resin sealed semiconductor according to the present invention will now be explained in detail by referring to the drawings.

Figure 1:
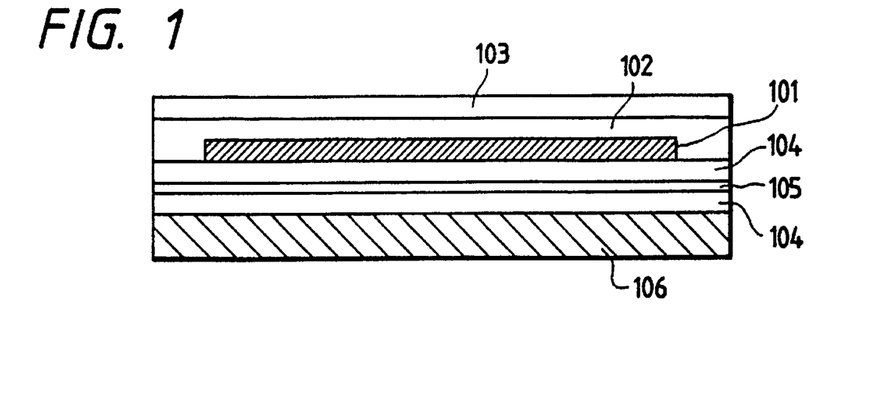
FIG. 1 is a schematic sectional view illustrating an example of the light transmitting resin sealed semiconductor device.

FIG. 1 shows an outline of the construction of a solar cell module according to the present invention. This solar cell module comprises photovoltaic element 101 which is a photoelectric transducer, front surface filler 102, front surface film 103, back surface filler 104, back surface covering film 105, and reinforcing plate 106. In this solar cell module, light from the outside enters surface film 103 and reaches photovoltaic element 101; the electromotive force generates in photovoltaic element 101 is supplied to an output terminal (not shown).

Photovoltaic Element 101

Figure 2A:
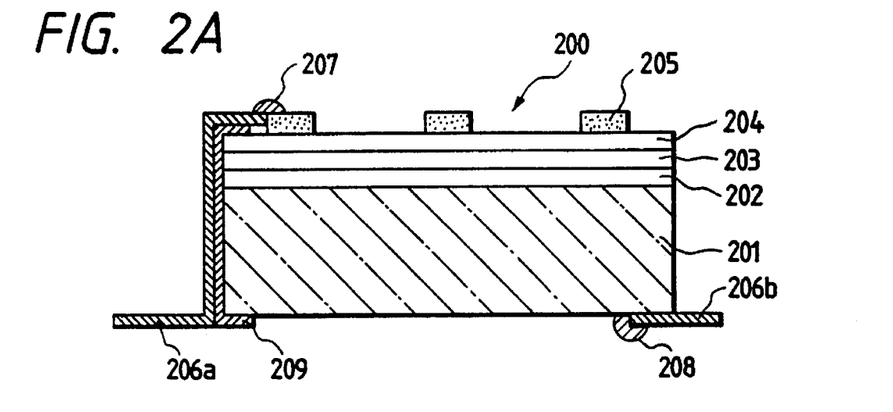
FIG. 2A is a schematic sectional view and FIG. 2B is an upper plan view.
Figure 2B:
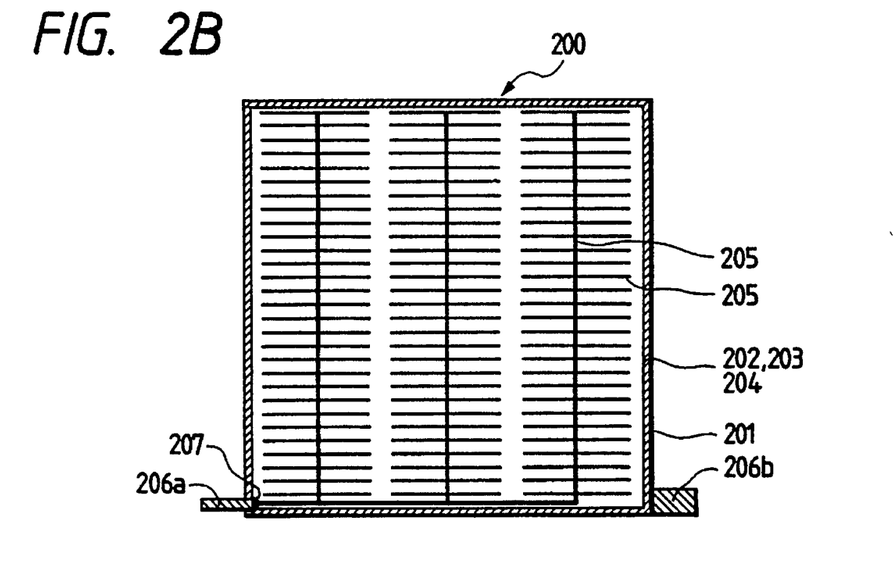

In photovoltaic element 101 in the present invention, a semiconductor photoactive layer is formed as the light converting member on a conductive substrate and an example is shown in FIGS. 2A and 2B for its schematic structure. As shown in FIGS. 2A and 2B, photovoltaic element 101 comprises substrate 201 having a conductive surface, back surface reflective layer 202, semiconductor photoactive layer 203, transparent conductive layer 204, and collecting electrode 205.

Conductive Substrate 201

Conductive substrate 201 is the substrate of photovoltaic element and at the same time serves as the lower electrode. Conductive substrate 201 may be made from silicon, tantalum, molybdenum, tungsten, stainless, aluminum, copper, titanium, carbon sheet, lead plated steel plate, and resin films and ceramics formed with a conductive upper layer. On conductive substrate 201, a metal layer or metal oxide layer or a metal layer and metal oxide layer may be formed as back surface reflective layer 202. The metal layer may be made from Ti, Cri, Mo, W, Al, Ag, Ni, and Cu. The metal oxide layer may be made from ZnO, $TiO_2$, $SnO_2$, and ITO. Examples of the forming methods of the metal layer and metal oxide layer mentioned above include resistance heating vapor deposition, electron beam vapor deposition, and sputtering.

Semiconductor Photoactive Layer 203

Semiconductor photoactive layer 203 is the layer where photoelectric conversion is performed. Examples of the material for semiconductor photoactive layer 203 include pn junction type polycrystalline silicon, pin junction type amorphous silicon and alloys thereof (including fine crystals, a-SiGe and a-SiC), and compound semiconductors and junction pairs such as CuInSe, $CuInS_2$, GaAs, $CdS/Cu_2S$, CdS/CdTe, CdS/InP, and $CdTe/Cu_2Te$. The forming method of semiconductor photoactive layer 203 is sheet formation by molten silicon or heat treatment of amorphous silicon for the case of polycrystalline silicon; plasma CVD is employed for depositing amorphous silicon using, as the starting material, silane gas and a conductivity type determining gas such as diborane and phosphine gas; and ion plating, ion beam deposition, vacuum evaporation, sputtering and electrodeposition are used for forming the confound semiconductors.

Conductive Layer 204

Conductive layer 204 serves as one of the electrodes of the solar cell. Examples of the material for conductive layer 204 at the incident light side include $In_2O_3$, $SnO_2$, $In_2O_3$-$SnO_2$ (ITO), ZnO, $TiO_2$, $Cd_2SnO_4$, and crystalline semiconductor layers where an impurity is doped in a high concentration. Examples of the forming methods of the transparent semiconductor layer 204 include resistance heating vapor deposition, sputtering, spraying, CVD, and impurity diffusion.

On the transparent conductive layer 204, collecting electrode 205 (grid) may be provided in the form of a grating or the like for the purpose of collecting the electric current efficiently. Examples of the material for collecting electrode 205 include: Ti, Cr, Mo, W, Al, Ag, Ni, Cu, Sn, and their alloys; and various conductive pastes such as silver paste. Examples of methods of forming collecting electrode 205 include: sputtering using a mask pattern; resistance heating vapor deposition; CVD; a process comprising vapor depositing a metal film over the whole surface and selective removal thereafter by etching to form a pattern; process of forming a grid electrode pattern directly by photo CVD; a process comprising forming a negative pattern mask of the grid electrode and plating thereafter; and a process of printing a conductive paste and allowing it to cure. The conductive paste used usually contains, fine powder of silver, gold, copper, nickel, or carbon dispersed in a binder polymer. Examples of the binder polymer include resins such as polyester, epoxy, acrylic, alkyd, polyvinyl acetate, rubbery, urethane, and phenolic.

Output Terminals 206a, 206b

Finally, output terminals 206 for outputting the electromotive force are connected to conductive substrate 201 and collecting electrode 205. In this procedure, a metallic body such as a copper tab is joined to conductive substrate 201 by spot welding or soldering, and a metallic body is electrically connected to collecting electrode 205 with a conductive paste or solder.

Photovoltaic element 101 prepared as mentioned above is connected in series and/or parallel depending on the desired voltage or current. The photovoltaic element may be integrated on an insulated substrate to supply voltage or current as desired.

Back Surface Covering Film 105

Back surface covering film 105 is provided for the purpose of securing electric insulating between the conductive substrate of photovoltaic element 101 and the exterior. The material is preferably able to provide sufficient electrical insulation from the conductive substrate, can resist thermal expansion and contraction, and has long term durability and flexibility. Suitable examples for the film include nylon and polyethylene terephthalate.

Back Surface Filler 104

Back surface filler 104 connects photovoltaic element 101 with back surface covering film 105. Preferable materials for the back surface filler 104 provide adhesion with the conductive substrate, are resistant to effects from thermal expansion and contraction, excellent in long term durability, and are flexible. Examples of suitable materials include hot materials such as EVA and polyvinyl butyral, double coated tape, and flexible epoxy adhesives.

Cross-linking is preferable for making the adhesion firm at a high temperature when the solar cell module is used at elevated temperatures such when integrated with roofing material. It is common to use an organic peroxide for cross-linking EVA and the like.

Reinforcing plate 106 may be adhered via back surface filler 104 to the outside of back surface covering film 105 for enhancing the mechanical strength of solar cell module or for preventing distortion and deflection caused by temperature change. Steel plate, plastic plate, or glass fiber reinforced plastic (FRP) may be, for example, employed as reinforcing plate 106.

Front Surface Filler 102

Front surface filler 102 used in the present invention will now be explained in detail.

Surface filler 102 is necessary for covering the concavities and convexities of photovoltaic element 101 and providing adhesion to surface film 103; thus weatherability, adhesion, and heat resistance are required for surface filler 102. It is desirable for satisfying these requirements that the main resin component is a cross-linked copolymer that has two or more types of monomer (multi-component copolymer), contains fluorine in an amount corresponding to 60 to 80%, and contains vinylidene fluoride and hexafluoropropylene as the major components. When the fluorine content in the multi-component copolymer is 60% or more, the weatherability of the fluororesin becomes sufficient and fire retardancy can be realized as well. On the other hand, when the fluorine content in the multi-component copolymer is 80% or less, sufficient adhesion can be maintained at the interface of the transparent electrode on the surface of photovoltaic element and the surface film. If the adhesion is insufficient, the reliability of solar cell module is impaired, i.e. peeling might occur during use over a long time period and moisture might penetrate. Such peeling might be prevented by heating at a temperature of 240° C. or higher when thermal adhesion is made; however, the heat may damage the solar cell element and thus this procedure cannot be adopted.

The ratio of the monomers, vinylidene fluoride (hereinafter may be abbreviated as VDF) to hexafluoropropylene (hereinafter may be abbreviated as HFP), is set so that the copolymer is a rubbery polymer. Usually, VDF-HFP copolymer becomes a good rubber when the VDF content is 50 to 80 molar %. When the VDF content is high, the glass transition point tends to be lowered and the low temperature resistance is improved. However, VDF units tend to coagulate or crystallize due to hydrogen bonding and introduction of HFP units in an amount exceeding a certain level is necessary for obtaining a highly transparent amorphous rubber that is suitable for covering of solar cells. Thus, introduction of HFP units in an amount of about 20 molar % or more is preferred for providing sufficient rubber elasticity and transparency suitable for the use in the present invention.

Furthermore, a terpolymer is applicable for the purpose of improving heat resistance and chemical resistance by adding tetrafluoroethylene (TFE) to VDF and HFP. In this case, the physical properties are improved while the rubber elasticity is maintained by replacing VDF units with TFE units; the ratio of replacement is preferably 1 to 30 molar %.

The organic peroxides employed for cross-linking the filler of the present invention will now be explained in detail. Cross-linking with an organic peroxide is performed by free radicals generated from the organic peroxide which remove hydrogen and/or halogen atoms to form C—C bonds. Known activation processes for organic peroxides are thermal decomposition, redox decomposition, and ionic decomposition. Thermal decomposition is most preferred in general.

On the basis of chemical structure, the organic peroxides may be classified into the categories of: hydroperoxides, dialkyl(allyl)peroxides, diacylperoxides, peroxyketals, peroxyesters, peroxycarbonates, and ketoneperoxides.

Examples of hydroperoxides include t-butylperoxide, 1,1,3,3-tetramethylbutylperoxide, p-menthanehydroperoxide, cumenhydroperoxide, p-cymenehydroperoxide, diisopropylbenzeneperoxide, 2,5-dimethylhexane-2,5-didihydroperoxide, cyclohexaneperoxide and 3,3,5-trimethylhexanoneperoxide.

Examples of dialkyl(allyl)peroxides include di-t-butylperoxide, dicumylperoxide and t-butylcumylperoxide.

Examples of diacylperoxides include diacetylperoxide, dipropionylperoxide, diisibutyrylperoxide, dioctanoylperoxide, didecanoylperoxide, dilauroylperoxide, bis(3,3,5-trimethylhexanoyl)peroxide, benzoylperoxide, m-toluylperoxide, p-chlorobenzoylperoxide, 2,4-dichlorobenzoylperoxide and peroxysuccinate.

Examples of peroxyketals include 2,2-di-t-butylperoxybutane, 1,1-di-t-butylperoxycyclohexane, 1,1-di-(t-butylperoxy)-3,3,5-trimethylcyclohexane, 2,5-dimethyl-2,5-di(-t-butylperoxy)hexane, 2,5-dimethyl-2,5-di(t-butylperoxy)hexyne-3, 1,3-di(t-butylperoxyisopropyl)benzene, 2,5-dimethyl-2,5-dibenzoylperoxyhexane, 2,5-dimethyl-2-5-di(peroxybenzoyl)hexyne-3, and n-butyl-4,4-bis(t-butylperoxy)valerate.

Examples of peroxyesters include t-butylperoxyacetate, t-butylperoxyisobutylate, t-butylperoxybivalerate, t-butylperoxyneodecanoate, t-butylperoxy-3,3,5-trimethylhexanoate, t-butyl-peroxy-2-ethylhexanoate, (1,1,3,3-tetramethylbutylperoxy)2-ethylhexanoate, t-butylperoxylaurate, t-butylperoxybenzoate, di(t-butylperoxy)adipate, 2,5-dimethyl-2,5-di(peroxy-2-ethylhexanoyl)hexane, di(t-butylperoxy)isophthalate, t-butylperoxymaleate, and acetylcyclohexylsulphonylperoxide.

Examples of peroxycarbonates include t-butylperoxyisopropylcarbonate, di-n-propylperoxydicarbobate, di-sec-butylperoxydicarbonate, di(isopropylperoxy)dicarbonate, di(2-ethylhexylperoxy)dicarbonate, di(2-ethoxyethylperoxy)dicarbonate, di(methoxidepropylperoxy)carbonate, di(3-methoxybutylperoxy)dicarbonate, and bis-(4-t-butylcyccohexylperoxy)dicarbonate.

Examples of ketoneperoxides include acetylacetoneperoxide, methylethylketoneperoxide, methylisobutylketoneperoxide, and ketoneperoxide.

Other structures such as vinyltris(t-butylperoxy)silane are known as well.

The amount of the above-mentioned organic peroxides to be added is 0.5 to 5 parts by weight per 100 parts by weight of the filler resin. The organic peroxides may be used in combination with the filler to induce cross-linking and bonding under pressure with heating. The heating temperature and period of time is set according to the temperature of the thermal decomposition of the respective organic peroxide. Generally, application of heat and pressure is terminated at the temperature and period of time where the thermal decomposition has proceeded 90% or more, preferably 95% or more.

For the purpose of conducting the cross-linking reaction efficiently, use of triallylisocyanurate (TAIC), known as a cross-linking auxiliary agent, is preferred. The amount of the cross-linking auxiliary agent is generally 1 to 5 parts by weight per 100 parts by weight of the filler resin.

While the material used in the present invention as the invention as the filler is excellent in weatherability, an ultraviolet absorber may be used in combination for the purpose of further improving the weatherability and protecting the layer below (from the side of incident light) the filler. Any known ultraviolet absorbers may be used; however, a low volatility ultraviolet absorber is preferred in consideration of the environment where the solar cell module is served. Simultaneous addition of a light stabilizer with the ultraviolet absorber will provide a filler film more stabilized against light.

A fluororesin in general is supposed to be relatively poor in heat resistance compared to the weatherability; addition of an antioxidant may be possible.

When the solar cell module is intended to be used under severe circumstances, it is preferred to improve the adhesion of the filler to the photovoltaic element or to the uppermost surface film. For this purpose, a silane coupling agent or organic titanate compound may be added to the filler. The amount to be added in this case is preferably 0.1 to 3 parts by weight, more preferably 0.25 to 1 parts by weight, per 100 parts by weight of the filler resin. Examples of silane coupling agents include vinyltrichlorosilane, vinyltris(β-methoxyethoxy)silane, vinyltriethoxysilane, vinyltrimethoxysilane, γ-methacryloxypropyltrimethoxysilane, β-(3,4-epoxycyclohexyl)ethyltrimethoxysilane, γ-glycidoxypropylmethyldiethoxysilane, N-β(aminoethyl)γ-aminopropyltrimethoxysilane, N-β(aminoethyl)-γ-aminopropylmethyldimethoxysilane, γ-aminopropylmethyldimethoxysilane, γ-aminopropyltriethoxysilane, N-phenyl-γ-aminopropyltrimethoxysilane, γ-mercaptopropyltrimethoxysilane, and γ-chlororpropyltrimethoxysilane.

Nonwoven materials such as glass fiber may be incorporated for the purpose of increasing the strength of the filler.

Front Surface Film 103

Uppermost (front) surface film 103 used in the present invention is required to have performance that will guarantee long term reliability in outdoor exposure of the solar cell module; the required performance includes weatherability, water repellancy, resistance to fouling, and mechanical strength. Suitable materials for use in the present invention are poly(vinylidene fluoride) resin and ethylene tetrafluoride-ethylene copolymer. While poly(vinylidene fluoride) is superior in respect of weatherability, tetrafluoride-ethylene copolymer is superior in respect of compatibility of weatherability and mechanical strength. Corona treatment and plasma treatment of the surface film are preferable for improving the adhesion between the uppermost film and filler.

As a means of fixing the solar cell module according to the present invention, for example when installed on a roof, bending of the ends of the solar cell module may be performed.

Uniaxially drawing may be performed for some ethylene tetrafluoride-ethylene copolymers for improving the mechanical strength of the uppermost film; characteristic of such film are lower breaking elongation and higher breaking tensile strength in the drawn direction than the direction of the film that is not drawn.

When bending fabrication is made using the uniaxially drawn film, breaking or cracking tends to develop at the bend. If thus has been necessary for to bend with a large curvature or at an elevated temperature. Accordingly to the present invention, it is found now that use of the film which is not drawn makes free the bending process from such requirements.

Now, a process for producing a solar cell module using the photovoltaic element, filler, surface film, and back surface covering material mentioned above will be explained.

As methods of covering the light receiving surface of photovoltaic element 101 with front surface filler 102, there are: evaporating solvent after coating filler material dissolved in a solvent; forming a filler layer on the surface film beforehand and adhering it under pressure on the photovoltaic element with heating; and forming the filler in a sheet form beforehand and adhering it under pressure on the photovoltaic element with heating.

In the case of dissolving filler 102 in a solvent as described above, the filler is mixed simultaneously with various kinds of additives such as a cross-linking agent, silane coupling agent, UV absorbing agent, antioxidant, and the like. The mixture is coated on the photovoltaic element and allowed to dry at such temperature that cross-linking reaction does not occur. Likewise, in the case of forming the filler in a sheet form, additives are mixed with the filler beforehand; it is required to adjust the forming temperature at such temperature that the cross-linking reaction does not occur.

In the case where the filler is preliminarily formed either on photovoltaic element 101 or on front surface film 103, a solar cell module is obtained by superimposing back surface filler 104 and back surface covering film 105 on the back surface and adhering them under pressure with heat and by superimposing surface film 103 on the front surface and adhering it under pressure with heat. In the case of providing reinforcing plate 106, it is sufficient to pressurize and adhere the plate to back surface covering film 105 via back surface filler 104 or a different adhesive. This procedure may be performed simultaneously with or after the process described above. In the case where the filler is formed in a sheet form, it may be inserted between photovoltaic element 101 and front surface film 103 and likewise thermally adhered under pressure to produce a solar cell module. The temperature of heating at the adhering step under pressure should allow the cross-linking reaction to proceed satisfactorily and the period of time of this step should also satisfy this requirement.

The method of adhesion under pressure may be vacuum lamination, roll lamination, and the like.

The present invention is explained in details by the following examples.

EXAMPLE 1

A procedure to prepare an amorphous silicon (a-Si) solar cell (photovoltaic element) is explained by the using schematic diagram of FIGS. 2A and 2B.

An Al layer (film thickness: 5000 Å) and ZnO layer (film thickness: 5000 Å) as back surface reflecting layer 202 were formed in this order on a cleaned stainless steel substrate (conductive substrate 201) by a sputtering method. As the next step, an n type a-Si layer was formed from a gas mixture of $SiH_4$, $PH_3$, and $H_2$, i type a-Si layer was formed from a gas mixture of $SiH_4$ and $H_2$, and p type microcrystal µc-Si layer was formed from a gas mixture of $SiH_4$, $BF_3$, and $H_2$ by a plasma CVD method. A tandem type a-Si (amorphous silicon type) photoelectric converting semiconductor layer (photoactive semiconductor layer 203) was formed, consisting of n layer of 150 Å film thickness/i layer of 4000 Å film thickness/p layer of 100 Å film thickness/n layer of 100 Å film thickness/i layer of 800 Å film thickness/p layer of 100 Å film thickness. Then, a thin film, as transparent conductive layer 204, of $In_2O_3$ (film thickness: 700 Å) was formed by vaporizing In under an $O_2$ atmosphere by resistance heating method. Further, a grid electrode for electric collecting electrodes 205 was formed by screen printing using a silver paste. Finally, a copper tab as negative terminal 206b was attached on the stainless steel substrate by using stainless steel solder 208. As positive terminal 206a, a silver foil tape was attached on electric collecting electrode 205 by using conductive adhesive 207 to provide the output terminal. A photovoltaic element was thus produced.

Figure 3:
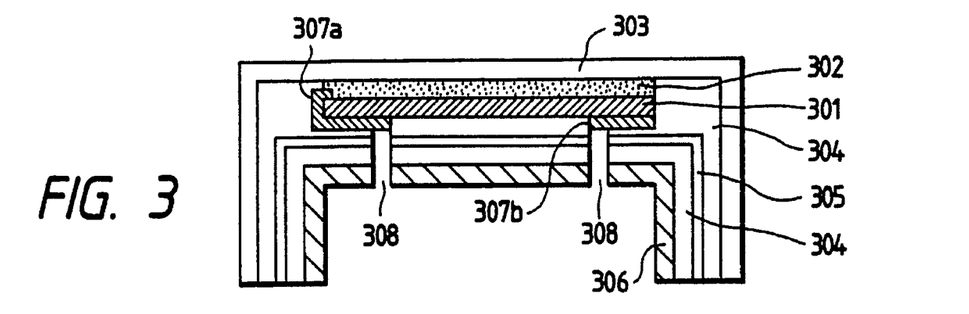
FIG. 3 is a schematic sectional view of a solar cell module according to the present invention.

A process for producing a solar cell module from this photovoltaic element is now explained by referring to FIG. 3.

Into a solvent which is a mixture of acetone and methyl ethyl ketone in the ratio of 3:2, 100 parts by weight of a VDF-HFP fluororubber (a copolymer of about 80 molar % VDF and about 20 molar % HFP, fluorine content 66%: iodine cross-linking site), 1.5 parts by weight of 2,5-dimethyl-2,5-di(tertiary butyl peroxide) hexane as the cross-linking agent, 4.0 parts by weight of triaryl isocyanurate as the auxiliary cross-linking agent, 0.5 parts by weight of γ-methacryl oxypropyl trimethoxy silane as the silane coupling agent, 0.3 parts by weight of 2-hydroxy-4-n-octoxy benzophenone as the UV absorbing agent, and 0.2 parts by weight of tris(mono-nonylphenyl) phosphite as the antioxidant were dissolved to prepare a 50% by weight solution of the fluororubber. The light receiving surface of photovoltaic element 301 was coated with the solution and dried at 60° C. for 30 minutes. This process of coating/drying was repeated until filler layer 302 of about 200 µ film thickness was formed.

On the incident light side surface of photovoltaic element 301 covered with the above-mentioned filler, surface film 303 (film thickness: 50 µ) of non-oriented ETFE film having one surface treated by corona discharge was provided in such a manner that the treated surface contacted the filler; on the back side, filler 304 (of 460 Å film thickness, manufactured by Mobay) containing EVA sheet, back surface coating film 305 composed of a nylon film (of 63.5 µ film thickness, trade name: Dartech, manufactured by du Pont), reinforcing plate 306 made of Galvarium steel sheet (galvanized steel sheet) were superimposed so that the order was photovoltaic element 301/back surface filler (EVA) 304/back surface coating film (nylon) 305/back surface filler (EVA) 304/reinforcing plate (Galvarium steel sheet) 306. A solar cell module with its light receiving surface covered with the fluororubber was produced by heating at 160° C. for 20 minutes while degassing under pressure by a vacuum lamination device. The output terminal was mounted on the back surface of the photovoltaic element beforehand so that, after lamination, the output might be obtained from the output terminal outlet opened beforehand in the Galvarium steel sheet. Finally, extra Galvarium steel sheet protruding from the photovoltaic element was bent together with the laminated materials at 90° to the back surface side so that module strength and the ease of installation as a roof incorporated type module might be improved.

The solar cell module produced by above process was evaluated in terms of the items described hereinafter.

EXAMPLE 2

Figure 4:
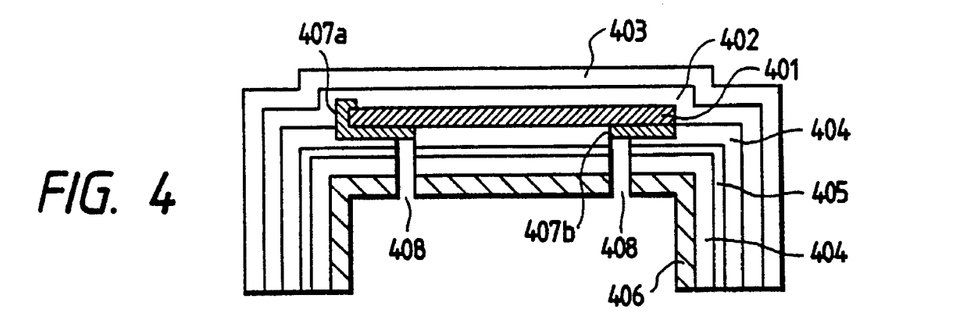
FIG. 4 is a schematic sectional view of another solar cell module according to the present invention.

Example 2 according to the present invention is explained by referring to FIG. 4.

A photovoltaic element was prepared in the same way as in Example 1.

To 100 parts by weight of the fluororubber the same as in Example 1, 1.5 parts by weight of 2'5'-dimethyl-2,5-di(tertialbutylperoxy)hexane as the cross-linking agent, 4 parts by weight of triallylisocyanurate (TAIC) as the cross-linking auxiliary agent, 0.5 parts by weight of γ-methacryloxypropyltrimethoxysilane as the silane coupling agent were blended to prepare a fluororubber sheet. That is, the VDF- HFP fluororubber was wound around kneading rolls warmed at 70° to 80° C.; thereafter, TAIC and the silane coupling agent were added in small amount; kneading was performed; the kneaded product was removed from the rollers; the rollers were allowed to cool to 50° C., the rubber was again would around the rolls; and the cross-linking agent was added therein and the rubber was kneaded uniformly. A portion of the product was removed and formed into a sheet of about 2 mm thickness.

The above fluororubber sheet 402 then was provided on the surface of photovoltaic element 401; surface film 403 (50 microns thickness) comprising undrawn ETFE, one surface of which was subjected to corona treatment was superimposed thereon so that the treated surface became in contact with the filler; and the lamination and post treatment were made in the same way as Example 1 to obtain a solar cell module. Reference numerals 401, 403 to 408 in FIG. 4 correspond to 301, 303 to 308 in FIG. 3.

EXAMPLE 3

A solar cell module was produced in the same manner as Example 1 except that the fluororubber used was a copolymer VDF-HFP fluororubber containing 71% of fluorine, about 50 molar % of VDF and about 50 molar % of HFP (cross-linked site: bromine).

EXAMPLE 4

A solar cell module was produced in the same manner as Example 2 except that the fluororubber used was a copolymer VDF-HFP fluororubber containing 71% of fluorine, about 50 molar % of VDF and about 50 molar % of HFP (cross-linked site: bromine).

EXAMPLE 5

A solar cell module was produced in the same manner as Example 1 except that the covering material was of the same structure as Example 2, replacing the coating of the fluororubber solution on photovoltaic element 301 with the coating on surface film 303.

COMPARATIVE EXAMPLE 1

Figure 5:
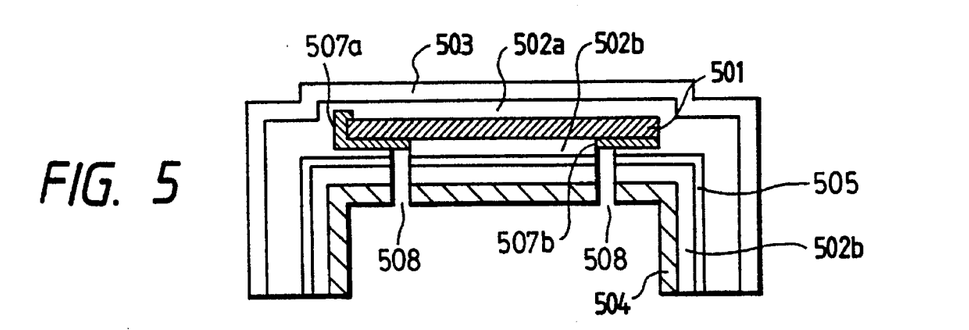
FIG. 5 is a schematic sectional view of a solar cell module shown for the purpose of comparison.

Comparative Example 1 is now explained by referring FIG. 5 for the purpose of demonstrating the effects of the Examples performed more clearly.

Surface filler 502a (manufactured by Mobay, 460 microns thickness) comprising EVA sheet, front surface covering film 503 (50 microns thickness) comprising undrawn ETFE film, one surface of which was provided on the light receiving surface side of photovoltaic element 501 prepared in the same way as mentioned above; at the back side, reinforcing plate 504, back surface filler 502b comprising EVA sheet (manufactured by Mobay, 460 microns thickness), back surface film 503 comprising nylon film (manufactured by Du Pont, trade name Dartech, 63.5 microns thickness), and Galvarium steel sheet (zinc plated steel sheet) was provided; and the order of superimposition was front surface covering film (ETFE) 503/front surface filler (EVA) 502a/photovoltaic element 501/back surface filler (EVA) 502b/back surface covering film (nylon) 503/back surface filler (EVA) 502b/reinforcing plate (steel sheet) 506. The assembly was laminated in a vacuum lamination device. Thereafter, bending as in Example 1 was applied to form a solar cell module.

COMPARATIVE EXAMPLE 2

The VDF-HFP copolymer fluororubber containing 66% of fluorine, about 80 molar % of VDF and about 20 molar % of HFP (cross-linked site: iodine) of Example 1 was replaced with a VDF-HFP copolymer fluororubber containing 66% of fluorine, about 80 molar % of VDF and about 20 molar % of HFP (cross-linked site: bromine). In addition, the cross-linking was made by using, as the cross-linking agent, 6 parts by weight of calcium hydroxide and 3 parts by weight of N,N-dicyanamilidene-1,6-hexanediamine per 100 parts by weight of the fluororubber. The other procedures were same as Example 1 and a solar cell module was thus prepared.

COMPARATIVE EXAMPLE 3

The cross-linking agent of Example 2 was not added. Except for this, Example 2 was repeated to obtain a solar cell module.

The solar cell modules prepared in the above Examples 1 to 5 and in Comparative Examples 1 to 3 were evaluated for the following criteria. The results are shown in Table 1.

(1) Conversion Efficiency

The conversion efficiency of the modules was determined by use of AM 1.5 light source. The conversion efficiency was evaluated with relative values by setting the conversion efficiency of Comparative Example 1 as one (1).

(2) Fire Retardancy

A flame that was 750 degrees in temperature and generated by a gas burner was applied to the module for 10 minutes, and thereafter the burner flame was removed and the combustibility of the module was observed. When the burned area was small and the flame of the module was extinguished immediately after removing the burner flame, the fire retardancy was judged "Good (G)"; when the burned area was 1 meter length or longer or self-extinguishing was not observed after removing the burner flame, the fire retardancy was judged "Poor (P)"; and when the condition was between (G) and (P), the fire retardancy was judged "Fair (F)".

(3) Weatherability

The solar cell module was placed in a Dew Cycle Weather-O-Meter, and an accelerated weathering test was performed with a cycle or light irradiation and rain: the change in appearance after 5000 hours was observed. When no change was observed, the weatherability was judged "Good (G)".

(4) Heat Resistance

The solar cell module was left in an atmosphere of 150° C. for 24 hours and the change in appearance was observed. When no change was observed, the weatherability was judged "Good (G)".

(5) Creep Resistance

The solar cell module was oriented vertically in an oven at a temperature of 100° C. and left for a week. Observation was made to check whether or not creep and peeling occurred. When creep or peeling was observed, the creep resistance was judged "Poor (P)"; if not, judged "Good (G)".

(6) Temperature Cycle

A temperature cycle consisting of −40° C. for one hour and 85° C. for one hour was repeated 50 times. After the run, the solar cell module was observed for change of appearance. If no change was observed, the temperature cycle was judged "Good (G)".

(7) Temperature-Humidity Cycle

A temperature-humidity cycle consisting of −40° C. for one hour and 85° C. at relative humidity of 85% for 4 hours was repeated 20 times. After the test, the solar cell module was observed for change of appearance. If no change was observed, the temperature cycle was judged "Good (G)".

(8) Humidity Resistance

The solar cell module was provided in an atmosphere of 85° C. and 85% relative humidity and irradiation was applied by a solar simulator; pseudo sunlight was irradiated on the light receiving surface. After 24 hours, performance of the solar cell was evaluated in terms of the relative lowering of the conversion efficiency; photo deterioration of the photovoltaic element was excluded from the evaluation.

In Comparative Example 2, where bromine was the site of cross-linking in the test fluororubber, initial conversion efficiency of the fluororubber of cross-linked polyamine was proved to be low.

In Comparative Example 3, where non cross-linked rubber was used, creep resistance was poor although deterioration in the weatherability test was not observed and the problem of interface peeling in the cycle tests did not occur; the filler deformed and crept easily at the elevated temperature and the shape just after the lamination was difficult to maintain. Thus, it is essential to cross-link the fluororubbers used as the filler of solar cell modules.

The solar cell module and its production according to the present invention are not limited by the above Examples in any way, and can be, of course, modified in various manners within the scope of the spirit of the invention.

In the solar cell module according to the present invention covering material is provided on the surface of the incident light side of a photovoltaic element and comprises two layers: (1) a transparent filler and (2) a transparent surface sheet provided at the uppermost outer surface of the filler, wherein the filler comprises a cross-linked multi-component copolymer containing 60 to 80% of fluorine and containing

TABLE 1

| | Conversion efficiency | Fire retardancy | Weather-ability | Heat resistance | Creep resistance | Temperature cycle | Temperature humidity cycle | Humid resistance |
|---|---|---|---|---|---|---|---|---|
| Example | | | | | | | | |
| 1 | 1.05 | G | G | G | G | G | G | 0.02 |
| 2 | 1.05 | G | G | G | G | G | G | 0.02 |
| 3 | 1.05 | G | G | G | G | G | G | 0.02 |
| 4 | 1.05 | G | G | G | G | G | G | 0.02 |
| 5 | 1.05 | G | G | G | G | G | G | 0.02 |
| Comp. Example | | | | | | | | |
| 1 | 1 | P | G | EVA turned yellowish | G | G | G | 0.37 |
| 2 | 0.81 | G | G | G | G | G | G | 0.05 |
| 3 | 0.94 | G | G | G | P | G | G | 0.02 |

As is apparent from Table 1, the solar cell modules of Examples 1 to 5 that have the fillers of cross-linked products of fluororubber derived from vinylidene fluoride and hexafluoropropylene are excellent in fire retardancy; and they are also excellent in weatherability and heat resistance as proved by the weatherability test and heating test where no yellowing, cloudiness, and deformation of the resin were observed. Furthermore, the cross-linked fluororubbers showed excellent characteristics in the creep test at elevated temperature. In the temperature cycle test and temperature-humidity cycle test that imitated severe outdoor service conditions, no changes in appearance were observed. The fluororubbers proved to be excellent in moisture resistance by preventing lowering of the conversion efficiency by limiting the effect of moisture on the elements to minimum extents. In contrast, Comparative Example 1, where conventionally used EVA was used and the above severe tests were performed, showed high combustibility in particular; fire retardancy was not realized with the thickness tested in Comparative Example 1. There were also problems of substantial yellowing due to heat and low moisture resistance. Fire retardancy and heat resistance were lower in Comparative Example 1 than other cases.

vinylidene fluoride and hexafluoropropylene as the major components; and the surface sheet comprises a film of 40 to 60% fluorine content. Thereby, the long term reliability of the surface covering material, which was a problem conventionally, in the outdoor service has been substantially improved with respect to fire retardancy, weatherability, heat resistance, and creep resistance.

What is claimed is:

1. A light-transmissive resin sealed semiconductor comprising a covering material provided on the incident light side surface of a photoelectric transducer, said covering material comprising a cross-linked multi-component copolymer containing vinylidene fluoride and hexafluoropropylene as the major components.

2. A light-transmissive resin sealed semiconductor according to claim 1, wherein the multi-component copolymer is a binary copolymer comprising 50 to 85 molar % of vinylidene fluoride and 15 to 50 molar % of hexafluoropropylene or a terpolymer comprising 50-x to 85-x molar % of vinylidene fluoride, 15 to 50 molar % of hexafluoropropylene and x molar % of tetrafluoroethylene, wherein x is 1 to 30, or a mixture thereof.

3. A light-transmissive resin sealed semiconductor according to claim 1, wherein the multi-component copolymer has a bromine atom at the end of the polymer chain and is cross-linked by an organic peroxide with the cross-linking site of the bromine atom.

4. A light-transmissive resin sealed semiconductor according to claim 1, wherein the covering material contains a silane coupling agent.

5. A light-transmissive resin sealed semiconductor according to claim 1, wherein a surface film comprising a polymer containing 40 to 60% by weight of fluorine is provided on the surface of the covering material.

6. A light-transmissive resin sealed semiconductor according to claim 5, wherein the surface film is an ethylene-tetrafluoroethylene copolymer.

7. A light-transmissive resin sealed semiconductor according to claim 5, wherein the surface film has not been subjected to drawing treatment.

8. A light-transmissive resin sealed semiconductor according to claim 1, wherein the photovoltaic element comprises a semiconductor photoactive layer as a light converting member formed on a conductive substrate and a transparent conductive layer on the photoactive layer.

9. A light-transmissive resin sealed semiconductor according to claim 8, wherein the semiconductor photoactive layer comprises a non-monocrystalline semiconductor thin film.

10. A light-transmissive resin sealed semiconductor according to claim 9, wherein the non-monocrystalline semiconductor thin film comprises amorphous silicon.

11. A process for producing a light-transmissive resin sealed semiconductor in which a covering material provided on the surface of the incident light side of a photoelectric transducer comprises two layers: (1) a filler and (2) a surface film provided at the the uppermost outer surface of the filler, the process comprising the steps of:

a step in which a cross-linking agent is added to a resin comprising a fluorine-containing multi-component copolymer containing vinylidene fluoride and hexafluoropropylene as the major components and formed into a film to prepare a filler in a sheet form; and a step in which the filler layer and a surface film comprising a fluororesin are laminated in that order on the photoelectric transducer, and thereafter the photoelectric transducer, the filler and the surface film are thermally bonded and simultaneously the filler is cross-linked.

12. A process for producing a light-transmissive resin sealed semiconductor in which a covering material provided on the surface of the incident light side of a photoelectric transducer comprises two layers: (1) a filler and (2) a surface film located at the uppermost outer surface of the filler, the process comprising the steps of:

a step in which a resin comprising a fluorine-containing multi-component copolymer containing vinylidene fluoride and hexafluoropropylene as the major components and a cross-linking agent are dissolved into a solvent and the resultant solution is coated on to the photoelectric transducer and thereafter allowed to dry to form a filler on the photoelectric transducer; and a step in which a surface film comprising a fluororesin is laminated on the filler, and thereafter the filler and the surface film are thermally bonded and simultaneously the filler is cross-linked.

13. A process for producing a light-transmissive resin sealed semiconductor in which a covering material provided on the surface of the incident light side of a photoelectric transducer comprises two layers: (1) a filler and (2) a surface film provided at the uppermost outer surface of the filler, the process comprising the steps of:

a step in which a resin comprising a fluorine-containing multi-component copolymer containing vinylidene fluoride and hexafluoropropylene as the major components and a cross-linking agent are dissolved into a solvent to prepare a filler material and the filler material is coated on the surface film comprising a fluororesin and thereafter allowed to dry to form the filler material laminated on the surface film; and a step in which the filler material and the surface film are laminated on the photoelectric transducer such that the filler material is in contact with the photoelectric transducer, and thereafter the filler material and the photoelectric transducer are thermally bonded and simultaneously the filler material is cross-linked.

14. A process for producing a light-transmissive resin sealed semiconductor according to any one of claims 11 to 13, wherein the multi-component copolymer is either a binary copolymer comprising 50 to 85 molar % of vinylidene fluoride and 15 to 50 molar % of hexafluoropropylene or a terpolymer comprising 50-x to 85-x molar % of vinylidene fluoride, 15 to 50 molar % of hexafluoropropylene and x molar % of tetrafluoroethylene, wherein x is 1 to 30, or a mixture thereof.

15. A process for producing a light-transmissive resin sealed semiconductor according to any one of claims 11 to 13, wherein the filler is cross-linked by an organic peroxide at the time of thermal adhesion.

16. A process for producing a light-transmissive resin sealed semiconductor according to any one of claims 11 to 13, wherein a silane coupling agent is added to the filler.

17. A process for producing a light-transmissive resin sealed semiconductor according to any one of claims 11 to 13, wherein the surface film is an ethylene-tetrafluoroethylene copolymer.

18. A process for producing a light-transmissive resin sealed semiconductor according to any one of claims 11 to 13, wherein the surface film has not been subjected to drawing treatment.

19. A process for producing a light-transmissive resin sealed semiconductor according to any one of claims 11 to 13, wherein the photoelectric transducer is formed by providing a semiconductor photoactive layer as a light converting member formed on a conductive substrate and a transparent conductive layer on the photoactive layer.

20. A process for producing a light-transmissive resin sealed semiconductor according to claim 19, wherein the semiconductor photoactive layer is a non-monocrystalline semiconductor thin film.

21. A process for producing a light-transmissive resin sealed semiconductor according to claim 20, wherein the non-monocrystalline semiconductor thin film is amorphous silicon.

* * * * *

UNITED STATES PATENT AND TRADEMARK OFFICE
CERTIFICATE OF CORRECTION

PATENT NO. : 5,597,422

DATED : January 28, 1997

INVENTORS : ICHIRO KATAOKA ET AL.

It is certified that error appears in the above-identified patent and that said Letters Patent is hereby corrected as shown below:

COLUMN 2

Line 7,   "idheres" should read --adheres--.

COLUMN 3

Line 17,  "net" should read --not--;
   Line 18,  "giver" should read --give--;
   Line 39,  "flexability" should read --flexibility--.

COLUMN 7

Line 16,  "rubbery," should read --rubber--.

COLUMN 10

Line 53,  "If thus has been necessary for to bend" should read --It thus has been necessary to bend the film--.

COLUMN 11

Line 36,  "details" should read --detail--;
   Line 43,  "the using" should read --using the--.

COLUMN 12

Line 42,  "output terminal was" should read --output terminals 307a and 307b were--;
   Line 62,  "2'5'-dimethyl" should read --2,5-dimethyl--.

UNITED STATES PATENT AND TRADEMARK OFFICE
CERTIFICATE OF CORRECTION

PATENT NO. : 5,597,422

DATED : January 28, 1997

INVENTORS : ICHIRO KATAOKA ET AL.

It is certified that error appears in the above-identified patent and that said Letters Patent is hereby corrected as shown below:

COLUMN 13

Line 57, "film 503" should read --film 506--
Line 59, "Galvarium" should read --reinforcing plate 504 comprising Galvarium--;
Line 63, "503/back" should read --505/back--;
Line 64, "sheet) 506." should read --sheet) 504. Output terminals 507a and 507b were also provided.--.

COLUMN 14

Line 49, "or" should read --of--.

Signed and Sealed this

Ninth Day of September, 1997

Attest:

BRUCE LEHMAN

Attesting Officer    Commissioner of Patents and Trademarks